(12) United States Patent
Cheng et al.

(10) Patent No.: US 12,720,738 B2
(45) Date of Patent: Aug. 25, 2026

(54) VOLTAGE LEVEL SHIFTER

(71) Applicant: eMemory Technology Inc., Hsin-Chu (TW)

(72) Inventors: Yu-Hsuan Cheng, Hsinchu County (TW); Sung-Ling Hsieh, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 7 days.

(21) Appl. No.: 18/824,926

(22) Filed: Sep. 5, 2024

(65) Prior Publication Data

US 2025/0088179 A1 Mar. 13, 2025

Related U.S. Application Data

(60) Provisional application No. 63/537,860, filed on Sep. 12, 2023.

(51) Int. Cl.

| | |
|---|---|
| ***H03K 19/00*** | (2006.01) |
| ***H03K 3/356*** | (2006.01) |
| ***H03K 17/10*** | (2006.01) |
| ***H03K 17/687*** | (2006.01) |
| ***H03K 19/0185*** | (2006.01) |
| ***H10B 20/25*** | (2023.01) |
| ***H10B 41/30*** | (2023.01) |
| ***H10B 41/42*** | (2023.01) |

(52) U.S. Cl.

CPC ............ *H10B 20/25* (2023.02); *H03K 3/356* (2013.01); *H03K 17/102* (2013.01); *H03K 17/687* (2013.01); *H03K 19/0185* (2013.01); *H10B 41/30* (2023.02); *H10B 41/42* (2023.02)

(58) Field of Classification Search

CPC ....... H03K 19/0185; H03K 19/018507; H03K 19/018514; H03K 19/018521; H03K 19/018528; H03K 19/018557; H03K 19/018564; H03K 19/018571; H03K 19/018578

See application file for complete search history.

(56) References Cited

U.S. PATENT DOCUMENTS

| | | | |
|---|---|---|---|
| 7,145,370 | B2 | 12/2006 | Bernard |
| 7,580,311 | B2 | 8/2009 | Pesavento |

(Continued)

FOREIGN PATENT DOCUMENTS

| | | | |
|---|---|---|---|
| CN | 102480288 | B | 8/2016 |

*Primary Examiner* — Tuan T Lam
(74) *Attorney, Agent, or Firm* — Winton Hsu

(57) ABSTRACT

A voltage level shifter is provided. The voltage level shifter includes a main level shifter, a first bias level shifter and a second bias level shifter. The main level shifter includes a first N-type transistor and a second N-type transistor cross-coupled to each other, a third N-type transistor and a fourth N-type transistor controlled by a first bias voltage, a fifth N-type transistor and a sixth N-type transistor respectively controlled by a second bias voltage and a third bias voltage, and a first P-type transistor and a second P-type transistor configured to respectively receive an input signal and an inverted input signal which have opposite voltage values. The first bias level shifter generates the first bias voltage according to an enable signal. The second bias level shifter generates the second bias voltage and the third bias voltage according to the first bias voltage and the input signal.

15 Claims, 5 Drawing Sheets

(56) References Cited

U.S. PATENT DOCUMENTS

| | | | | |
|---|---|---|---|---|
| 7,847,590 | B2 * | 12/2010 | Pamperin | H03K 3/356113 326/68 |
| 8,368,425 | B2 * | 2/2013 | Huang | H03K 3/356182 327/333 |
| 11,152,941 | B2 * | 10/2021 | Shubin | H03K 19/00 |
| 11,277,121 | B1 * | 3/2022 | Goyal | H03K 3/356113 |
| 11,929,747 | B2 * | 3/2024 | Tsai | H03K 3/0375 |
| 12,206,408 | B2 * | 1/2025 | Wu | H03K 19/018521 |
| 12,283,952 | B2 * | 4/2025 | Chinthu | H03K 19/018521 |
| 2005/0134355 | A1 * | 6/2005 | Maede | H03K 3/356113 327/333 |
| 2009/0284282 | A1 * | 11/2009 | Matsumoto | H03K 3/35613 327/333 |
| 2010/0061164 | A1 * | 3/2010 | Tandon | G11C 5/147 365/189.11 |
| 2014/0015587 | A1 | 1/2014 | Chen | |
| 2019/0245526 | A1 * | 8/2019 | Satou | H03K 19/018507 |
| 2021/0250020 | A1 * | 8/2021 | Han | H03K 3/356182 |
| 2023/0238946 | A1 | 7/2023 | Lu | |
| 2024/0195394 | A1 * | 6/2024 | Panigrahi | H03K 19/0013 |

* cited by examiner

VOLTAGE LEVEL SHIFTER

CROSS REFERENCE TO RELATED APPLICATIONS

This application claims the benefit of U.S. Provisional Application No. 63/537,860, filed on Sep. 12, 2023. The content of the application is incorporated herein by reference.

BACKGROUND OF THE INVENTION

1. Field of the Invention

The present invention is related to level shifters, and more particularly, to a voltage level shifter which ensures that all transistors therein operate in safe operation areas.

2. Description of the Prior Art

When native components are used in an electronic circuitry, a voltage difference between any two terminals of each of the native components needs to be kept less than a predetermined value, in order to ensure that each native component operates in a safe operation area (SOA), to thereby preventing each native component from damaged or abnormality. A level shifter typically operates in a wide voltage range, and the SOA issue mentioned above is more likely to occur. More particularly, when a negative reference voltage is applied to the level shifter, making all components meet SOA regulations becomes more difficult.

Thus, there is a need for a novel architecture, which ensures that all components within the level shifter operate in the SOAs under various conditions.

SUMMARY OF THE INVENTION

An objective of the present invention provides a voltage level shifter, which is able to properly operate in both an erase mode and a non-erase mode (e.g. a read mode or a program mode) of a memory device without violating SOA regulations.

At least one embodiment of the present invention provides a voltage level shifter. The voltage level shifter comprises a main level shifter, a first bias level shifter and a second bias level shifter, where the first bias level shifter is coupled to the main level shifter, and the second bias level shifter is coupled to the main level shifter and the bias voltage level shifter. The main level shifter is configured to shift an input signal within a first voltage range to an output signal within a second voltage range. In detail, the main level shifter comprises a first N-type transistor, a second N-type transistor, a third N-type transistor, a fourth N-type transistor, a fifth N-type transistor, a sixth N-type transistor, a first P-type transistor and a second P-type transistor. Source terminals of the first N-type transistor and the second N-type transistor are coupled to a first reference voltage, where a drain terminal of the first N-type transistor is coupled to a gate terminal of the second N-type transistor, a drain terminal of the second N-type transistor is coupled to a gate terminal of the first N-type transistor, and the drain terminal of the first N-type transistor is configured to output the output signal. Source terminals of the third N-type transistor and the fourth N-type transistor are coupled to the drain terminals of the first N-type transistor and the second N-type transistor, respectively. Source terminals of the fifth N-type transistor and the sixth N-type transistor are coupled to drain terminals of the third N-type transistor and the fourth N-type transistor, respectively. Source terminals of the first P-type transistor and the second P-type transistor are coupled to a second reference voltage, and drain terminals of the first P-type transistor and the second P-type transistor are coupled to drain terminals of the fifth N-type transistor and the sixth N-type transistor, respectively, where gate terminals of the first P-type transistor and the second P-type transistor are configured to receive an inverted input signal and the input signal, respectively. More particularly, the input signal and the inverted input signal have opposite logic values. In addition, the first bias level shifter is configured to generate a first bias voltage to gate terminals of the third N-type transistor and the fourth N-type transistor according to an enable signal and a third reference voltage, and the second bias level shifter is configured to generate a second bias voltage to a gate terminal of the fifth N-type transistor and a third bias voltage to a gate terminal of the sixth N-type transistor according to the first bias voltage and the input signal.

At least one embodiment of the present invention provides a voltage level shifter. The voltage level shifter comprises a main level shifter and a bias level shifter, where the bias level shifter is coupled to the main level shifter. The main level shifter is configured to shift an input signal within a first voltage range to an output signal within a second voltage range. In detail, the main level shifter comprises a first N-type transistor, a second N-type transistor, a third N-type transistor, a fourth N-type transistor, a first P-type transistor and a second P-type transistor. Source terminals of the first N-type transistor and the second N-type transistor are coupled to a first reference voltage, where a drain terminal of the first N-type transistor is coupled to a gate terminal of the second N-type transistor, a drain terminal of the second N-type transistor is coupled to a gate terminal of the first N-type transistor, and the drain terminal of the first N-type transistor is configured to output the output signal. Source terminals of the third N-type transistor and the fourth N-type transistor are coupled to the drain terminals of the first N-type transistor and the second N-type transistor, respectively. Source terminals of the first P-type transistor and the second P-type transistor are coupled to a second reference voltage, and drain terminals of the first P-type transistor and the second P-type transistor are coupled to drain terminals of the third N-type transistor and the fourth N-type transistor, respectively, where gate terminals of the first P-type transistor and the second P-type transistor are configured to receive an inverted input signal and the input signal, respectively. More particularly, the input signal and the inverted input signal have opposite logic values. In addition, the bias level shifter is configured to generate a bias voltage to gate terminals of the third N-type transistor and the fourth N-type transistor according to an enable signal. In detail, the bias level shifter comprises a fifth N-type transistor, an sixth N-type transistor, a third P-type transistor and a fourth P-type transistor. Source terminals of the fifth N-type transistor and the sixth N-type transistor are coupled to a third reference voltage, where a drain terminal of the fifth N-type transistor is coupled to a gate terminal of the sixth N-type transistor, and a drain terminal of the sixth N-type transistor is coupled to a gate terminal of the fifth N-type transistor. Source terminals of the third P-type transistor and the fourth P-type transistor are coupled to the second reference voltage, and drain terminals of the third P-type transistor and the fourth P-type transistor are coupled to drain terminals of the fifth N-type transistor and the sixth N-type transistor, respectively, where gate terminals of the third P-type transistor and the fourth P-type transistor are configured to receive the enable signal and an inverted enable signal, respectively More particularly, the enable signal and the inverted enable signal have opposite logic values, and the drain terminal of the third P-type transistor is configured to output the bias voltage.

The voltage level shifter provided by the embodiments of the present invention utilize at least one auxiliary level shifter to provide at least one bias voltage to a main level shifter, in order to ensure that all transistors within the main level shifter meets the SOA regulations. In addition, the embodiments of the present invention will not greatly increase additional costs. Thus, the present invention can solve the problem of the related art without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
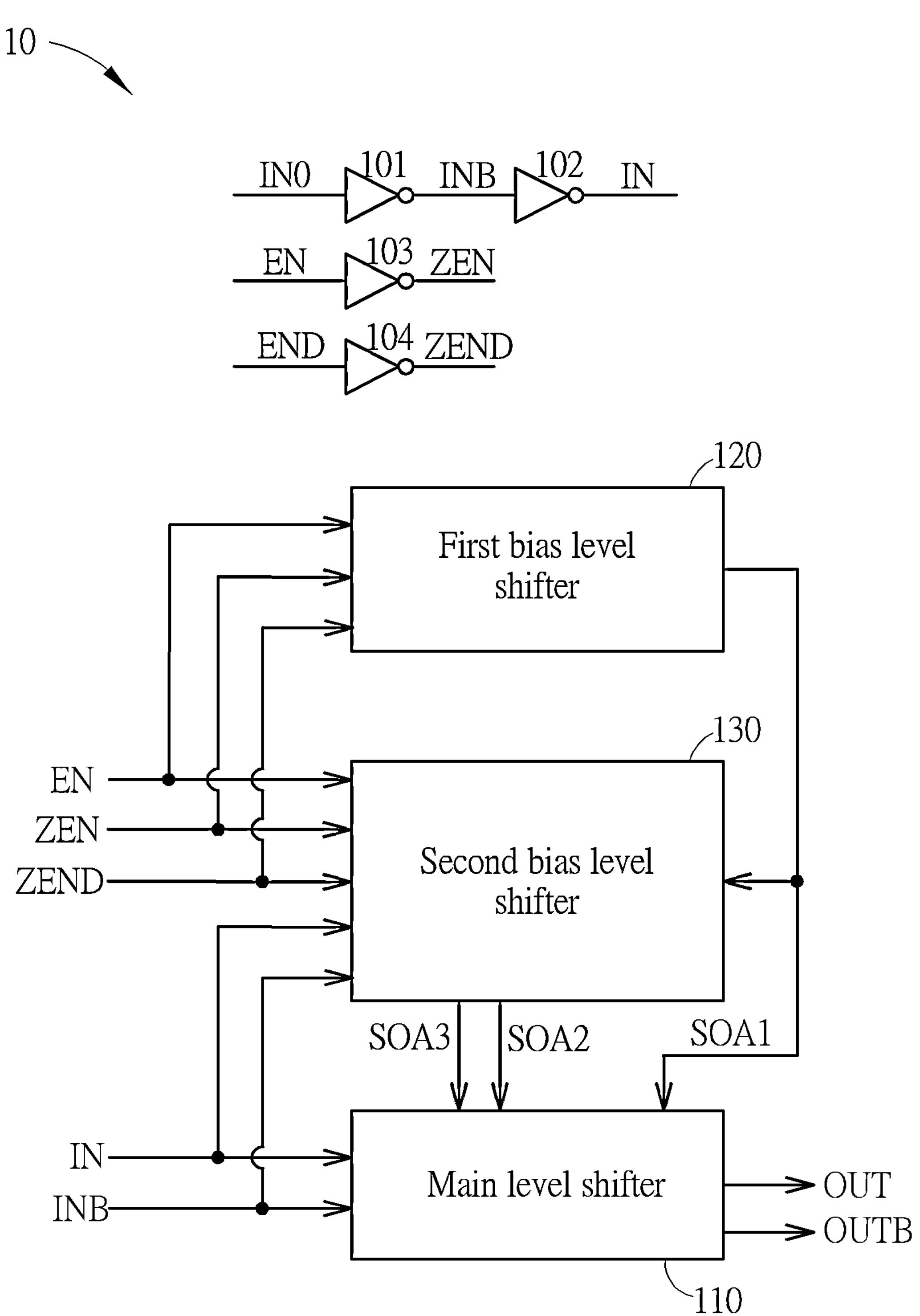
FIG. 1 is a diagram illustrating a voltage level shifter according to an embodiment of the present invention.

FIG. 1 is a diagram illustrating a voltage level shifter 10 according to an embodiment of the present invention. As shown in FIG. 1, the voltage level shifter 10 may comprise a main level shifter 110, a first bias level shifter 120, and a second bias level shifter 130, where the first bias level shifter 120 is coupled to the main level shifter 110, and the second bias level shifter 130 is coupled to the main level shifter 110 and the first bias level shifter 120. In this embodiment, the main level shifter 110 is configured to shift an input signal IN and an inverted input signal INB within a first voltage range to an output signal OUT and an inverted output signal OUTB within a second voltage range. In order to ensure that all transistors within the main level shifter 110 meet safe operation area (SOA) regulations, the main level shifter 110 receives a first bias voltage (e.g. a bias voltage SOA1) from the first bias level shifter 120, and further receives a second bias voltage (e.g. a bias voltage SOA2) and a third bias voltage (e.g. a bias voltage SOA3) from the second bias level shifter 130. For example, the first bias level shifter 120 is configured to generate the bias voltage SOA1 according to an enable signal EN, an inverted enable signal ZEN and a delayed inverted enable signal ZEND. The second bias level shifter 130 is configured to generate the bias voltages SOA2 and SOA3 according to the bias voltage SOA1, the input signal IN, the inverted input signal INB, the enable signal EN, the inverted enable signal ZEN and the delayed inverted enable signal ZEND.

In this embodiment, the input signal IN and the inverted input signal INB have opposite logic values. For example, the voltage level shifter 10 may further comprise inverters 101 and 102, where the inverter 101 may output the inverted input signal INB according to an original input signal IN0, and the inverter 102 may output the input signal IN according to the inverted input signal INB. In addition, the enable signal EN and the inverted enable signal ZEN have opposite logic values. For example, the voltage level shifter 10 may further comprise an inverter 103, where the inverter 103 may output the inverted enable signal ZEN according to the enable signal EN. In addition, the delayed inverted enable signal ZEND has a predetermined delay relative to the inverted enable signal ZEN. For example, the voltage level shifter 10 may further comprise an inverter 104, where the inverter 104 may output the delayed inverted enable signal ZEND according to a delayed enable signal END (which is generated by applying the predetermined delay to the enable signal EN). In another example, the delayed inverted enable signal ZEND may be generated by applying the predetermined delay to the inverted enable signal ZEN.

Figure 2:
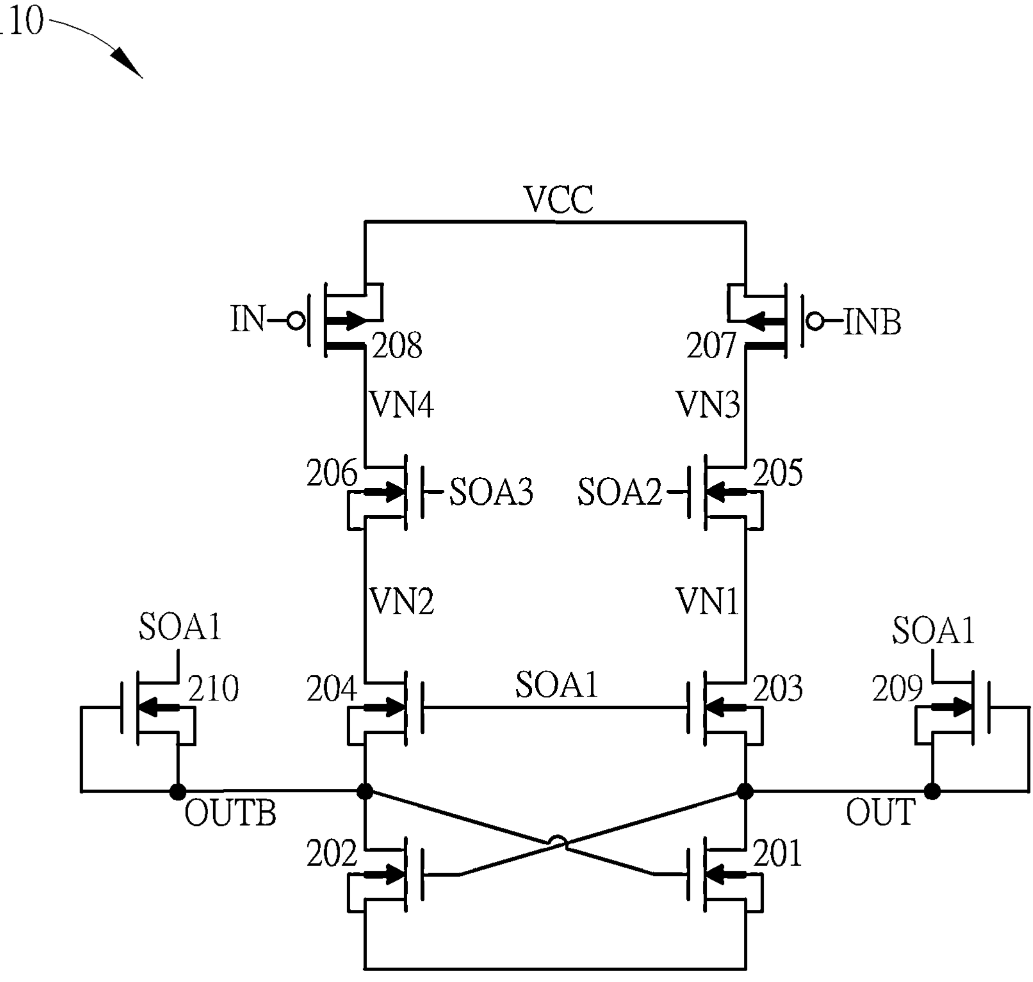
FIG. 2 is a diagram illustrating a main level shifter of the voltage level shifter shown in FIG. 1 according to an embodiment of the present invention.

FIG. 2 is a diagram illustrating the main level shifter 110 of the voltage level shifter 10 shown in FIG. 1 according to an embodiment of the present invention. As shown in FIG. 2, the main level shifter 110 may comprise N-type transistors 201, 202, 203, 204, 205 and 206, and P-type transistors 207 and 208. Source terminals of the N-type transistors 201 and 202 are coupled to a first reference voltage (e.g. a reference voltage VBB), where a drain terminal of the N-type transistor 201 is coupled to a gate terminal of the N-type transistor 202, and a drain terminal of the N-type transistor 202 is coupled to a gate terminal of the N-type transistor 201. Source terminals of the N-type transistors 203 and 204 are coupled to the drain terminals of the N-type transistors 201 and 202, respectively. Source terminals of the N-type transistors 205 and 206 are coupled to drain terminals of the N-type transistors 203 and 204, respectively. Source terminals of the P-type transistors 207 and 208 are coupled to a second reference voltage (e.g. a reference voltage VCC), and drain terminals of the P-type transistors 207 and 208 are coupled to drain terminals of the N-type transistors 205 and 206, respectively, where gate terminals of the P-type transistors 207 and 208 are configured to receive an inverted input signal and the input signal, respectively. In addition, gate terminals of the N-type transistors 203 and 204 are configured to receive the bias voltage SOA1 from the first bias level shifter 120, and gate terminals of the N-type transistors 205 and 206 are configured to receive the bias voltages SOA2 and SOA3, respectively. In this embodiment, the drain terminals of the N-type transistors 201 and 202 are configured to output the output signal OUT and the inverted output signal OUTB.

In this embodiment, the main level shifter 110 may further comprise N-type transistors 209 and 210. A gate terminal and a source terminal of the N-type transistor 209 are coupled to the drain terminal of the N-type transistor 201, a gate terminal and a source terminal of the N-type transistor 210 are coupled to the drain terminal of the N-type transistor 202, and drain terminals of the N-type transistors 209 and 210 are configured to receive the bias voltage SOA1. In addition, the N-type transistors 209 and 210 (which are diode connected) can limit upper bounds of voltage levels on the drain terminals of the N-type transistors 201 and 202 according to the bias voltage SOA1, respectively, which prevents the N-type transistors 201 and 202 from violating SOA regulations during a process of pulling the reference voltage VBB from the first voltage level V1 to the third voltage level V3 when the voltage level shifter 10 is switched from the first mode to the second mode.

It should be noted that the voltage level shifter 10 may be utilized in a memory device which may operate in a read mode, a program mode or an erase mode. More particularly, when the memory device operates in the read mode or the program mode, the voltage level shifter 10 may operate in a first mode (i.e. disabled mode). When the memory device operates in the erase mode, the voltage level shifter 10 may operate in a second mode (i.e. enabled mode). In detail, when the voltage level shifter 10 operates in the first mode, the enable signal EN is set to a first voltage level V1 such as 0 volts (V), and the reference voltage VBB is set to the first voltage level V1. When the voltage level shifter 10 operates in the second mode, the enable signal EN is set to a second voltage level V2 such as 2 V, and the reference voltage VBB is set to a third voltage level V3 (e.g. −9 V) lower than the first voltage level V1 (e.g. 0 V). In particular, V2>V1>V3 and the third voltage level V3 is negative.

It should be noted that the P-type transistors 207 and 208 may be implemented by laterally-diffused metal-oxide semiconductor (LDMOSs), which is able to tolerate higher voltage difference on terminals thereof. N-type transistors are unable to be implemented by LDMOSs in some semiconductor processes, however. Thus, a voltage difference between any two terminals of each of the N-type transistors 201, 202, 203, 204, 205, 206, 209 and 210 need to be limited below a predetermined level (e.g. 5 V). In order to ensure that all transistors within the voltage level shifter 10 properly operate in without any SOA issue, the bias voltages SOA1, SOA2 and SOA3 needs to be properly controlled. In detail, when the voltage level shifter 10 operates in the first mode, the bias voltages SOA1, SOA2 and SOA3 may be pulled to the second voltage level V2 (e.g. 2 V). When the voltage level shifter 10 operates in the second mode, the bias voltage SOA1 may be pulled to a fourth voltage level V4 (e.g. −4.5 V), where one of the bias voltages SOA2 and SOA3 may be pulled to the fourth voltage level V4, and the other one of the bias voltages SOA2 and SOA3 may be pulled to the first voltage level V1 minus a threshold voltage Vtn of N-type transistors, such as (V1−Vtn). It is assumed that all N-type transistors within the voltage level shifter 10 have a same threshold voltage (i.e. Vtn), but the present invention is not limited thereto.

The following embodiments will illustrate detailed architecture of the first bias level shifter 120 and the second level shifter 130, and more particularly, illustrate detailed operation of generating/controlling the bias voltages SOA1, SOA2 and SOA3.

Figure 3:
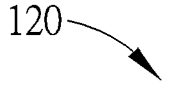
FIG. 3 is a diagram illustrating a first bias level shifter of the voltage level shifter shown in FIG. 1 according to an embodiment of the present invention.
Figure 3:
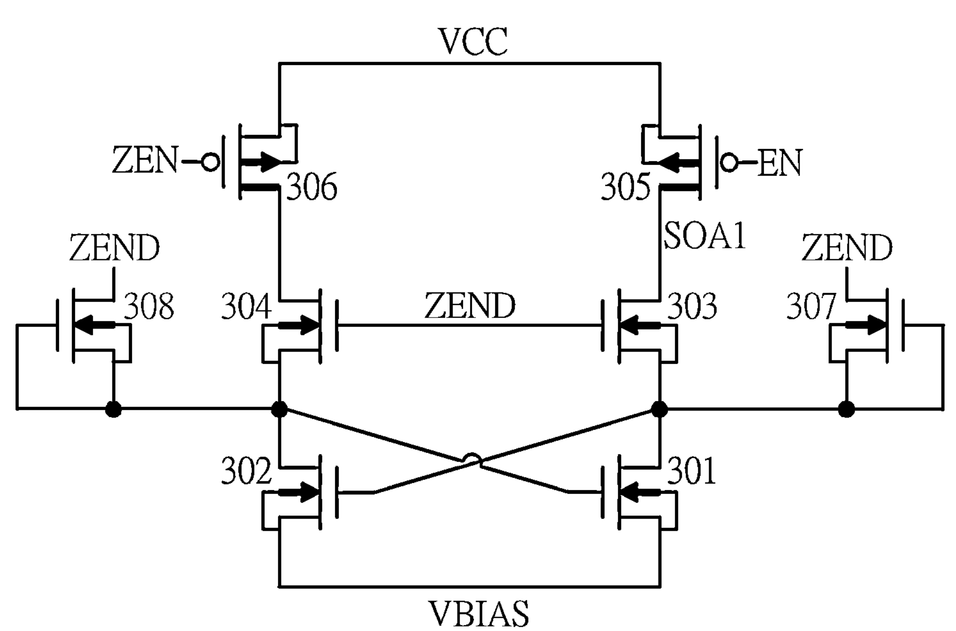

FIG. 3 is a diagram illustrating the first bias level shifter 120 of the voltage level shifter 10 shown in FIG. 1 according to an embodiment of the present invention. As shown in FIG. 3, the first bias level shifter 120 may comprise N-type transistors 301, 302, 303 and 304, and P-type transistors 305 and 306. Source terminals of the N-type transistors 301 and 302 are coupled to a third reference voltage (e.g. a reference voltage VBIAS), where a drain terminal of the N-type transistor 301 is coupled to a gate terminal of the N-type transistor 302, and a drain terminal of the N-type transistor 302 is coupled to a gate terminal of the N-type transistor 301. Source terminals of the N-type transistors 303 and 304 are coupled to the drain terminals of the N-type transistors 301 and 302, respectively. Source terminals of the P-type transistors 305 and 306 are coupled to the reference voltage VCC, and drain terminals of the P-type transistors 305 and 306 are coupled to drain terminals of the N-type transistors 303 and 304, respectively, where gate terminals of the P-type transistors 305 and 306 are configured to receive the enable signal EN and the inverted enable signal ZEN, respectively. More particularly, the drain terminal of the P-type transistor 305 is configured to output the bias voltage SOA1. In addition, gate terminals of the N-type transistors 303 and 304 are configured to receive the delayed inverted enable signal ZEND.

In this embodiment, the first bias level shifter 120 may further comprise N-type transistors 307 and 308, where a gate terminal and a source terminal of the N-type transistor 307 are coupled to the drain terminal of the N-type transistor 301, and a gate terminal and a source terminal of the N-type transistor 308 are coupled to the drain terminal of the N-type transistor 302. In addition, drain terminals of the N-type transistors 307 and 308 are configured to receive the delayed inverted enable signal ZEND. Similar to the function of the N-type transistors 209 and 210 within the main level shifter 110, the N-type transistors 307 and 308 can limit upper bounds of voltage levels on the drain terminals of the N-type transistors 301 and 302, respectively.

It should be noted that the P-type transistors 305 and 306 may be implemented by LDMOSs. In addition, when the voltage level shifter 10 operates in the first mode, the enable signal EN is set to the first voltage level V1, the inverted enable signal ZEN is set to the second voltage level V2, where both the reference voltage VBB and the reference voltage VBIAS are set to the fist voltage level V1. Thus, the P-type transistor 305 is turned on and the P-type transistor 306 is turned off, making the bias voltage SOA1 be pulled up to the voltage level of the reference voltage VCC (e.g. the second voltage level V2).

When the voltage level shifter 10 operates in the second mode, the enable signal EN is set to the second voltage level V2, the inverted enable signal ZEN is set to the first voltage level V1, where the reference voltage VBB is set to the third voltage level V3 (which is lower than the first voltage level V1), and the reference voltage VBB is set to the fourth voltage level (which is higher than the third voltage level and lower than the first voltage level). Thus, the P-type transistor 305 is turned off and the P-type transistor 306 is turned on, thereby making a voltage level of the drain terminal of the N-type transistor 301 being pulled down faster than a voltage level of the drain terminal of the N-type transistor 302. Eventually, the N-type transistor 301 is tuned on and the N-type transistor 302 is turned off, where both the N-type transistors 301 and 303 are turned on, and the bias voltage SOA1 is therefore pulled down to the voltage level of the reference voltage VBIAS (e.g. the fourth voltage level).

It should be noted that the reference voltage VBIAS is set at a voltage level between the first voltage level and the voltage level of the reference voltage VBB, where the bias voltage SOA1 may be controlled at the voltage level of the reference voltage VBIAS when the first bias level shifter 120 is activated in response to the enable signal EN being pulled to the second voltage level V2. For example, the reference voltage VBIAS may be set at a half of magnitude of the voltage level of the reference voltage VBB, but the present invention is not limited thereto.

Figure 4:
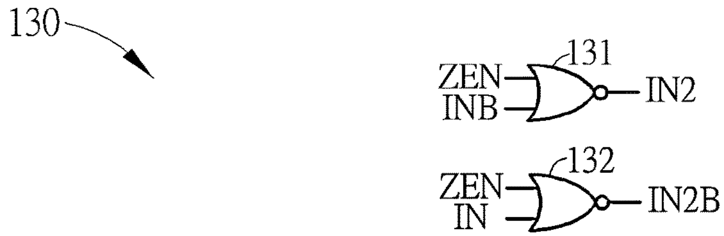
FIG. 4 is a diagram illustrating a second bias level shifter of the voltage level shifter shown in FIG. 1 according to an embodiment of the present invention.
Figure 4:
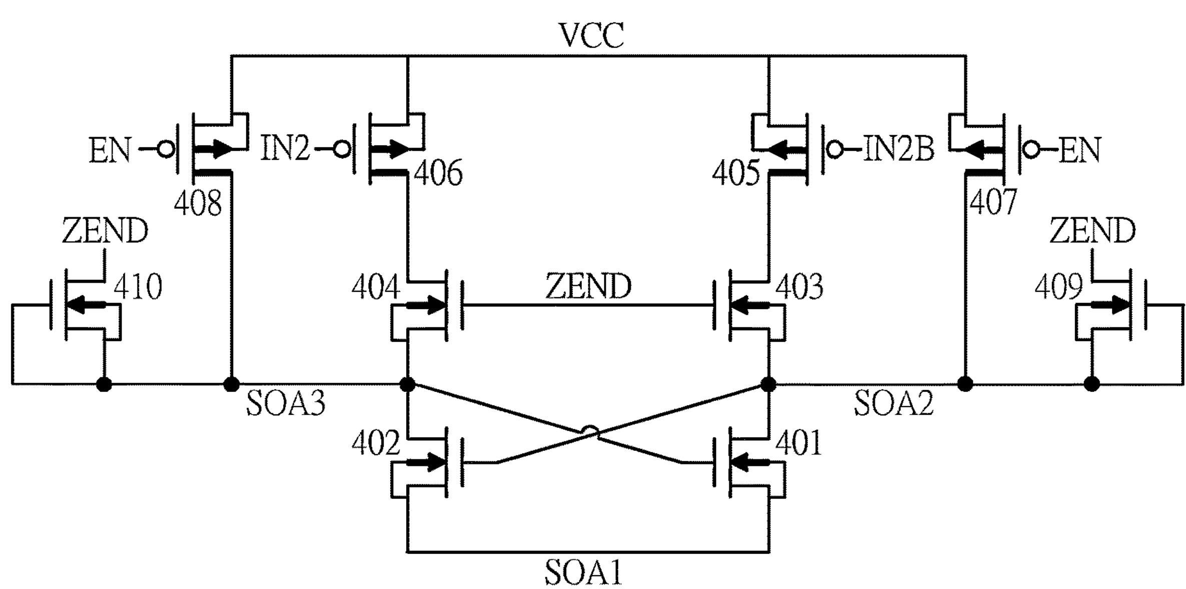

FIG. 4 is a diagram illustrating the second bias level shifter 130 of the voltage level shifter 10 shown in FIG. 1 according to an embodiment of the present invention. As shown in FIG. 4, the second bias level shifter 130 may comprise N-type transistors 401, 402, 403 and 404, and P-type transistors 405, 406, 407 and 408. Source terminals of the N-type transistors 401 and 402 are configured to receive the bias voltage SOA1 from the first bias level shifter 120, where a drain terminal of the N-type transistor 401 is coupled to a gate terminal of the N-type transistor 402, and a drain terminal of the N-type transistor 402 is coupled to a gate terminal of the N-type transistor 401. Source terminals of the N-type transistors 403 and 404 are coupled to the drain terminals of the N-type transistors 401 and 402, respectively. Source terminals of the P-type transistors 405 and 406 are coupled to the reference voltage VCC, and drain terminals of the P-type transistors 405 and 406 are coupled to drain terminals of the N-type transistors 403 and 404, respectively, where gate terminals of the P-type transistors 405 and 406 are configured to receive an inverted secondary input signal IN2B and a secondary input signal IN2, respectively. Source terminals of the P-type transistors 407 and 408 are coupled to the reference voltage VCC, and drain terminals of the P-type transistors 407 and 408 are coupled to the drain terminals of the N-type transistors 401 and 402, where gate terminals of the P-type transistors 407 and 408 are configured to receive the enable signal EN. It should be noted that the secondary input signal IN2 and the inverted secondary input signal IN2B are controlled according to the enable signal EN (e.g. the inverted enable signal ZEN which is generated according to the enable signal EN) and the input signal IN (and/or the inverted input signal INB), and the drain terminals of the N-type transistors 401 and 402 are configured to output the bias voltages SOA2 and SOA3, respectively. In addition, gate terminals of the N-type transistors 403 and 404 are configured to receive the delayed inverted enable signal ZEND.

In this embodiment, the second bias level shifter 130 may further comprise an N-type transistor 409 and a N-type transistor 410, where a gate terminal and a source terminal of the N-type transistor 409 are coupled to the drain terminal of the N-type transistor 401, and a gate terminal and a source terminal of the N-type transistor 410 are coupled to the drain terminal of the N-type transistor 402. In addition, drain terminals of the N-type transistors 409 and 410 are configured to receive the delayed inverted enable signal ZEND. Similar to the function of the N-type transistors 209 and 210 within the main level shifter 110, the N-type transistors 409 and 410 can limit upper bounds of voltage levels on the drain terminals of the N-type transistors 401 and 402, respectively.

It should be noted that the P-type transistors 405, 406, 407 and 408 may be implemented by LDMOSs. In addition, when the voltage level shifter 10 operates in the first mode, the enable signal EN is set to the first voltage level V1, and the secondary input signal IN2 and the inverted secondary input signal IN2B are set to the first voltage level V1. Thus, the P-type transistor 405, 406, 407 and 408 are turned on, where the bias voltages SOA2 and SOA3 are pulled up to the voltage level of the reference voltage VCC such as the second voltage level V2.

When the voltage level shifter 10 operates in the second mode, the enable signal EN is set to the second voltage level V2, and the secondary input signal IN2 and the inverted secondary input signal IN2B are set to be equivalent to the input signal IN and the inverted input signal INB, respectively. Assume that the input signal IN is set to the second voltage level V2, where secondary input signal IN2 and the inverted secondary input signal IN2B are therefore set to the second voltage level V2 and the first voltage level V1. Thus, the P-type transistor 406 is turned off and the P-type transistor 405 is turned on, thereby making the bias voltage SOA3 being pulled down faster than the bias voltage SOA2. Eventually, the N-type transistor 402 is tuned on to pulled down the bias voltage SOA3, and therefore the N-type transistor 401 is turned off, where the bias voltage SOA2 may be limited at the upper bound controlled by the N-type transistor 409.

In this embodiment, the second bias level shifter 130 may further comprise a NOR gates 131 and 132, where the NOR gate 131 may perform a NOR logic operation on the inverted enable signal ZEN and the inverted input signal INB to generate the secondary input signal IN2, and the NOR gate 132 may perform a NOR logic operation on the inverted enable signal ZEN and the input signal IN to generate the inverted secondary input signal IN2B, but the present invention is not limited thereto.

It should be noted that the second bias level shifter 130 may utilize the reference voltage VCC and the bias voltage SOA1 as reference voltages thereof, in order to output the bias voltages SOA2 and SOA3 at an interval between levels of the reference voltage VBIAS and the delayed inverted enable signal ZEND, thereby preventing the main level shifter 110 with well-designed levels of the bias voltages from undergoing SOA issues.

Assume that the input signal IN is set to the second voltage level V2. When the enable signal EN=V1 (which means the voltage level shifter 10 operates in the first mode), all of the bias voltages SOA1, SOA2 and SOA3 are pulled to the second voltage level V2. Under this bias condition, please refer to FIG. 2 again, as the P-type transistor 208 is turned off and the N-type transistors 202, 204 and 206 are turned on, all of the drain terminals (e.g. OUTB, VN2, VN4) of the N-type transistors 202, 204 and 206 are pulled to the first voltage level V1. In addition, as the P-type transistor 207 and the N-type transistors 203 and 205 are turned on and the N-type transistor 201 is turned off, the drain terminals (e.g. OUT, VN1 and VN3) of the N-type transistors 201, 203 and 205 are pulled to (V2−Vtn), (V2−Vtn) and V2, respectively.

When the enable signal EN=V2 (which means the voltage level shifter 10 operates in the second mode), the bias voltages SOA1, SOA2 and SOA3 are pulled to V4, −Vtn and V4, respectively. Under this bias condition, as the P-type transistor 208 is turned off and the N-type transistors 202, 204 and 206 are turned on, all of the drain terminals (e.g. OUTB, VN2, VN4) of the N-type transistors 202, 204 and 206 are pulled to the third voltage level V3. In addition, as the P-type transistor 207 and the N-type transistors 203 and 205 are turned on and the N-type transistor 201 is turned off, the drain terminals (e.g. OUT, VN1 and VN3) of the N-type transistors 201, 203 and 205 are pulled to (V4−Vtn), (−Vtn×2) and V2, respectively. Note that the bias voltages SOA1 and SOA2 which are respectively applied to the N-type transistors 203 and 205 can properly limit the voltage levels of the drain terminals (e.g. OUT and VN1) of the N-type transistors 201 and 203 at (V4−Vtn) and (−Vtn×2), respectively. Thus, the voltage level shifter 10 can ensure that all N-type transistors therein meet SOA regulations (e.g. a voltage difference between any two terminals of any component is less than 5 V).

As the operations of the voltage level shifter 10 under a condition of the input signal IN being set to the first voltage level V1 may be deduced by analogy, related details are omitted here for brevity.

Figure 5:
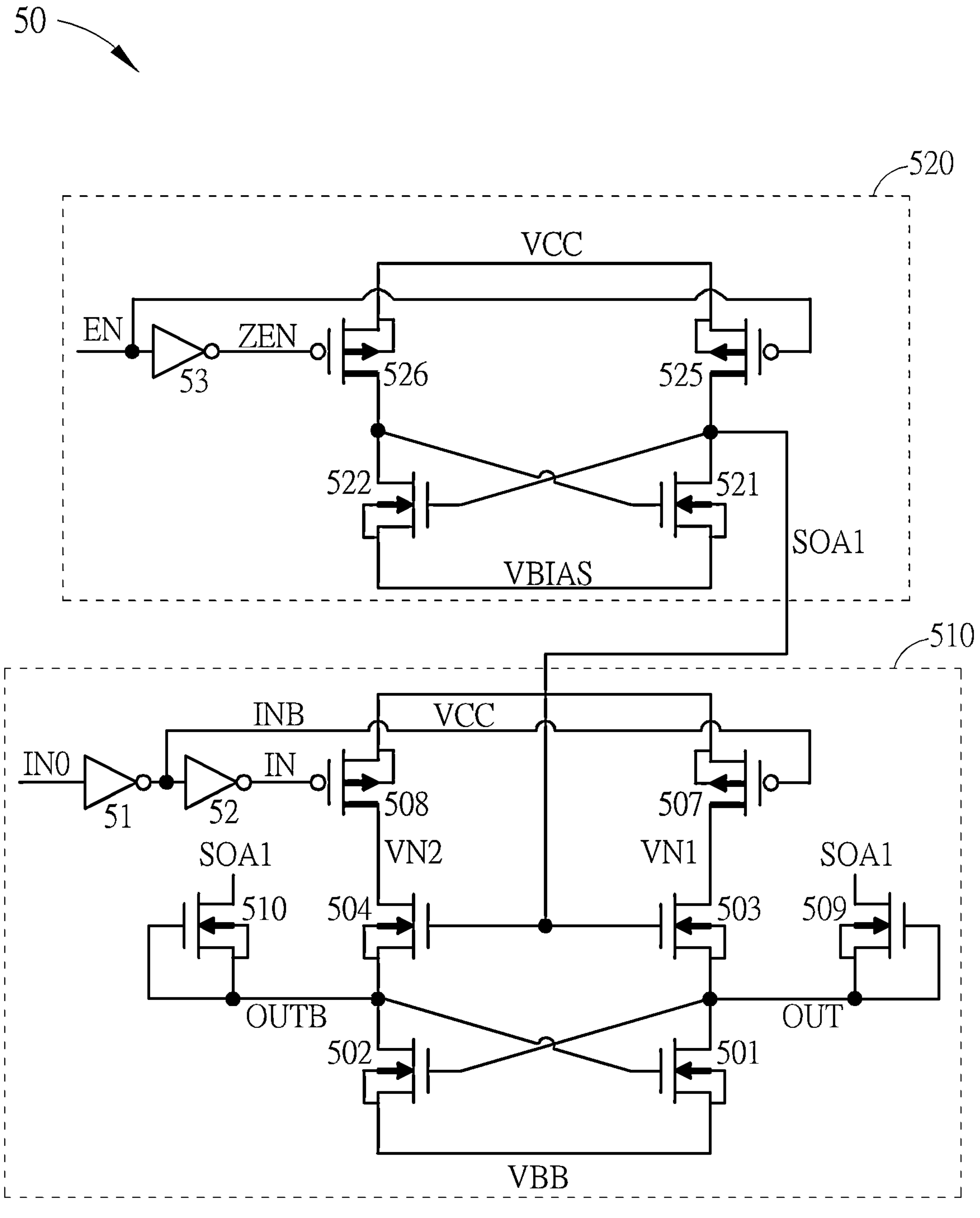
FIG. 5 is a diagram illustrating a voltage level shifter according to another embodiment of the present invention.

It should be noted that when a voltage range of a voltage level shifter is reduced (e.g. VCC=2 V and VBB=−6 V when this voltage level shifter operates in the second mode), the second bias level shifter 130 may be omitted, and some components within the main level shifter 110 and the first bias level shifter 120 may be omitted. FIG. 5 is a diagram illustrating a voltage level shifter 50 according to another embodiment of the present invention, where the voltage level shifter 50 can ensure that all transistors therein properly operate without SOA issues under a condition where the reference voltage VBB is with less negative voltage (e.g. −6 V instead of −9V), and a circuit cost thereof can be reduced in comparison with the voltage level shifter 10 shown in FIG. 1.

As shown in FIG. 5, the voltage level shifter 50 may comprise a main level shifter 510 and a first bias level shifter 520, where the first bias level shifter 520 is coupled to the main level shifter 510. The main level shifter 510 is configured to shift the input signal IN and the inverted input signal INB within the first voltage range to the output signal OUT and the inverted output signal OUTB within a third voltage range. The main level shifter 510 may comprise N-type transistors 501, 502, 503 and 504, and P-type transistors 507 and 508. Source terminals of the N-type transistors 501 and 502 are coupled to the reference voltage VBB, where a drain terminal of the N-type transistor 501 is coupled to a gate terminal of the N-type transistor 502, and a drain terminal of the N-type transistor 502 is coupled to a gate terminal of the N-type transistor 501. Source terminals of the N-type transistors 503 and 504 are coupled to the drain terminals of the N-type transistors 501 and 502, respectively. Source terminals of the P-type transistors 507 and 508 are coupled to the reference voltage VCC, and drain terminals of the P-type transistors 507 and 508 are coupled to drain terminals of the N-type transistors 503 and 504, respectively, where gate terminals of the P-type transistors 507 and 508 are configured to receive the inverted input signal INB and the input signal IN, respectively.

In addition, the first bias level shifter 520 is configured to generate the bias voltage SOA1 to gate terminals of the N-type transistors 503 and 504 according to the enable signal EN and the inverted enable signal ZEN. As shown in FIG. 5, the first bias level shifter 520 may comprise N-type transistors 521 and 522, and P-type transistors 525 and 526. Source terminals of the N-type transistors 521 and 522 are coupled to the reference voltage VBIAS, where a drain terminal of the N-type transistor 521 is coupled to a gate terminal of the N-type transistor 522, and a drain terminal of the N-type transistor 522 is coupled to a gate terminal of the N-type transistor 521. Source terminals of the P-type transistors 525 and 526 are coupled to the reference voltage VCC, and drain terminals of the P-type transistors 525 and 526 are coupled to drain terminals of the N-type transistors 521 and 522, respectively, where gate terminals of the P-type transistors 525 and 526 are configured to receive the enable signal EN and the inverted enable signal ZEN, respectively. More particularly, the drain terminal of the P-type transistor 525 is configured to output the bias voltage SOA1.

In this embodiment, the main level shifter 510 may further comprise N-type transistors 509 and 510, where a gate terminal and a source terminal of the N-type transistor 509 are coupled to the drain terminal of the N-type transistor 501, and a gate terminal and a source terminal of the N-type transistor 510 are coupled to the drain terminal of the N-type transistor 502, More particularly, drain terminals of the N-type transistors 509 and 510 are configured to receive the bias voltage SOA1. In addition, the N-type transistors 509 and 510 can limit upper bounds of voltage levels on the drain terminals of the N-type transistors 501 and 502 according to the bias voltage SOA1, respectively, which prevents the N-type transistors 501 and 502 from violating SOA regulations during a process of pulling the reference voltage VBB from the first voltage level V1 to a third voltage level V3' such as −6 V when the voltage level shifter 50 is switched from the first mode to the second mode.

It should be noted that the P-type transistors 507, 508, 525 and 526 may be implemented by LDMOSs. In addition, when the voltage level shifter 50 operates in the first mode (i.e. disabled mode), the enable signal EN is set to the first voltage level V1, and the reference voltage VBB is set to the first voltage level V1. More particularly, when the voltage level shifter 50 operates in the first mode, the P-type transistor 525 is turned on and the P-type transistor 526 is turned off, and the bias voltage SOA1 may be pulled to the voltage level of the reference voltage VCC (e.g. the second voltage level V2) by the P-type transistor 525. Thus, the first bias level shifter 520 pulls the bias voltage SOA1 to the second voltage level V2. When the voltage level shifter 50 operates in the second mode, the P-type transistor 525 is turned off and the P-type transistor 526 is turned on, and the drain terminal of the N-type transistor 522 (which is coupled to the gate terminal of the N-type transistor 521) may be pulled to the voltage level of the reference voltage VCC (e.g. the second voltage level V2) by the P-type transistor 526, where the N-type transistor 521 is turned on to pull the bias voltage SOA1 to the voltage level of the reference voltage VBIAS (e.g. a fourth voltage level V4'). Thus, the first bias level shifter 520 pulls the bias voltage SOA1 to the fourth voltage level V4' such as −2 V.

It should be noted that the reference voltage VBIAS is set at a voltage level between the first voltage level and the voltage level of the reference voltage VBB, where the bias voltage SOA1 may be controlled at the voltage level of the reference voltage VBIAS when the first bias level shifter 520 is activated in response to the enable signal EN being pulled to the second voltage level V2. For example, the reference voltage VBIAS may be set at a third of magnitude of the voltage level of the reference voltage VBB, but the present invention is not limited thereto. In addition, the first bias level shifter 520 may utilize the reference voltage VCC and the bias voltage VBIAS as reference voltages thereof, in order to output the bias voltage SOA1 having a voltage level which is approximately equal to the reference voltage VBIAS, thereby preventing the main level shifter 510 with a well-designed level of the bias voltage SOA1 from undergoing SOA issues.

Assume that the input signal IN is set to the second voltage level V2. When the enable signal EN=V1 (which means the voltage level shifter 50 operates in the first mode (i.e. disabled mode), the bias voltage SOA1 is pulled to the second voltage level V2. Under this bias condition, as the P-type transistor 508 is turned off and the N-type transistors 502 and 504 are turned on, both the drain terminals (e.g. OUTB and VN2) of the N-type transistors 502 and 504 are pulled to the first voltage level V1. In addition, as the P-type transistor 507 and the N-type transistors 503 are turned on and the N-type transistor 501 is turned off, the drain terminals (e.g. OUT and VN1) of the N-type transistors 501 and 503 are pulled to (V2−Vtn) and V2, respectively.

When the enable signal EN=V2 (which means the voltage level shifter 50 operates in the second mode), the bias voltages SOA1 is pulled to the fourth voltage level V4'. Under this bias condition, as the P-type transistor 508 is turned off and the N-type transistors 502 and 504 are turned on, both the drain terminals (e.g. OUTB and VN2) of the N-type transistors 502 and 504 are pulled to the third voltage level V3'. In addition, as the P-type transistor 507 and the N-type transistors 503 are turned on and the N-type transistor 501 is turned off, the drain terminals (e.g. OUT and VN1) of the N-type transistors 501 and 503 are pulled to (V4'−Vtn) and V2, respectively. Note that the bias voltage SOA1 which is applied to the N-type transistor 503 can properly limit the voltage level of the drain terminal (e.g. OUT) of the N-type transistors 501 at (V4'−Vtn). Thus, the voltage level shifter 50 can ensure that all N-type transistors therein meet SOA regulations (e.g. a voltage difference between any two terminals of any component is less than 5 V).

As the operations of the voltage level shifter 50 under a condition of the input signal IN being set to the first voltage level V1 may be deduced by analogy, and related descriptions are omitted here for brevity.

To summarize, the voltage level shifter provided by the embodiment of the present invention utilize at least one auxiliary level shifter to generate at least one bias voltage for transistors within the main level shifter, to thereby ensure that all transistors within the voltage level shifter meet SOA regulations. In addition, the embodiments of the present invention will not greatly increase additional costs. Thus, the present invention can solve the problem of the related art without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage level shifter, comprising:

a main level shifter, configured to shift an input signal within a first voltage range to an output signal within a second voltage range, wherein the main level shifter comprises:

a first N-type transistor and a second N-type transistor, wherein source terminals of the first N-type transistor and the second N-type transistor are coupled to a first reference voltage, a drain terminal of the first N-type transistor is coupled to a gate terminal of the second N-type transistor, a drain terminal of the second N-type transistor is coupled to a gate terminal of the first N-type transistor, and the drain terminal of the first N-type transistor is configured to output the output signal;

a third N-type transistor and a fourth N-type transistor, wherein source terminals of the third N-type transistor and the fourth N-type transistor are coupled to the drain terminals of the first N-type transistor and the second N-type transistor, respectively;

a fifth N-type transistor and a sixth N-type transistor, wherein source terminals of the fifth N-type transistor and the sixth N-type transistor are coupled to drain terminals of the third N-type transistor and the fourth N-type transistor, respectively; and a first P-type transistor and a second P-type transistor, wherein source terminals of the first P-type transistor and the second P-type transistor are coupled to a second reference voltage, drain terminals of the first P-type transistor and the second P-type transistor are coupled to drain terminals of the fifth N-type transistor and the sixth N-type transistor, respectively, and gate terminals of the first P-type transistor and the second P-type transistor are configured to receive an inverted input signal and the input signal, respectively;

wherein the input signal and the inverted input signal have opposite logic values;

a first bias level shifter, coupled to the main level shifter, configured to generate a first bias voltage to gate terminals of the third N-type transistor and the fourth N-type transistor according to an enable signal and a third reference voltage; and a second bias level shifter, coupled to the main level shifter and the first bias level shifter, configured to generate a second bias voltage to a gate terminal of the fifth N-type transistor and a third bias voltage to a gate terminal of the sixth N-type transistor according to the first bias voltage and the input signal.

2. The voltage level shifter of claim 1, wherein the main level shifter further comprises:

a seventh N-type transistor and an eighth N-type transistor, wherein a gate terminal and a source terminal of the seventh N-type transistor are coupled to the drain terminal of the first N-type transistor, a gate terminal and a source terminal of the eighth N-type transistor are coupled to the drain terminal of the second N-type transistor, and drain terminals of the seventh N-type transistor and the eighth N-type transistor are configured to receive the first bias voltage.

3. The voltage level shifter of claim 1, wherein:

when the voltage level shifter operates in a first mode, the enable signal is set to a first voltage level, and the first reference voltage is set to the first voltage level; and when the voltage level shifter operates in a second mode, the enable signal is set to a second voltage level, and the first reference voltage is set to a third voltage level lower than the first voltage level.

4. The voltage level shifter of claim 3, wherein:

when the voltage level shifter operates in the first mode, the first bias voltage, the second bias voltage and the third bias voltage are pulled to the second voltage level; and when the voltage level shifter operates in the second mode, the first bias voltage is pulled to a fourth voltage level, one of the second bias voltage and the third bias voltage is pulled to the fourth voltage level, and the other one of the second bias voltage and the third bias voltage is pulled to the first voltage level minus a threshold voltage of N-type transistors.

5. The voltage level shifter of claim 3, wherein when the voltage level shifter operates in the second mode, the third voltage level of the first reference voltage and a fourth voltage level of the third reference voltage are negative, and the fourth voltage level is between the first voltage level and the third voltage level.

6. The voltage level shifter of claim 1, wherein the first bias level shifter comprises:

a seventh N-type transistor and an eighth N-type transistor, wherein source terminals of the seventh N-type transistor and the eighth N-type transistor are coupled to the third reference voltage, a drain terminal of the seventh N-type transistor is coupled to a gate terminal of the eighth N-type transistor, and a drain terminal of the eighth N-type transistor is coupled to a gate terminal of the seventh N-type transistor;

a ninth N-type transistor and a tenth N-type transistor, wherein source terminals of the ninth N-type transistor and the tenth N-type transistor are coupled to the drain terminals of the seventh N-type transistor and the eighth N-type transistor, respectively; and a third P-type transistor and a fourth P-type transistor, wherein source terminals of the third P-type transistor and the fourth P-type transistor are coupled to the second reference voltage, drain terminals of the third P-type transistor and the fourth P-type transistor are coupled to drain terminals of the ninth N-type transistor and the tenth N-type transistor, respectively, and gate terminals of the third P-type transistor and the fourth P-type transistor are configured to receive the enable signal and an inverted enable signal, respectively;

wherein the enable signal and the inverted enable signal have opposite logic values, and the drain terminal of the third P-type transistor is configured to output the first bias voltage.

7. The voltage level shifter of claim 6, wherein gate terminals of the ninth N-type transistor and the tenth N-type transistor are configured to receive a delayed inverted enable signal, and the delayed inverted enable signal has a predetermined delay relative to the inverted enable signal.

8. The voltage level shifter of claim 6, wherein the first bias level shifter further comprises:

an eleventh N-type transistor and a twelfth N-type transistor, wherein a gate terminal and a source terminal of the eleventh N-type transistor are coupled to the drain terminal of the seventh N-type transistor, and a gate terminal and a source terminal of the twelfth N-type transistor are coupled to the drain terminal of the eighth N-type transistor.

9. The voltage level shifter of claim 8, wherein drain terminals of the eleventh N-type transistor and the twelfth N-type transistor are configured to receive a delayed inverted enable signal, and the delayed inverted enable signal has a predetermined delay relative to the inverted enable signal.

10. The voltage level of claim 6, wherein:

when the voltage level shifter operates in a first mode, the enable signal is set to a first voltage level, the inverted enable signal is set to a second voltage level, and both the first reference voltage and the third reference voltage are set to the first voltage level; and when the voltage level shifter operates in a second mode, the enable signal is set to the second voltage level, the inverted enable signal is set to the first voltage level, the first reference voltage is set to a third voltage level lower than the first voltage level, and the third reference voltage is set to a fourth voltage level, wherein the fourth voltage level is higher than the third voltage level and lower than the first voltage level.

11. The voltage level of claim 1, wherein the second bias level shifter comprises:

a seventh N-type transistor and an eighth N-type transistor, wherein source terminals of the seventh N-type transistor and the eighth N-type transistor are configured to receive the first bias voltage from the first bias level shifter, a drain terminal of the seventh N-type transistor is coupled to a gate terminal of the eighth N-type transistor, and a drain terminal of the eighth N-type transistor is coupled to a gate terminal of the seventh N-type transistor;

a ninth N-type transistor and a tenth N-type transistor, wherein source terminals of the ninth N-type transistor and the tenth N-type transistor are coupled to the drain terminals of the seventh N-type transistor and the eighth N-type transistor, respectively;

a third P-type transistor and a fourth P-type transistor, wherein source terminals of the third P-type transistor and the fourth P-type transistor are coupled to the second reference voltage, drain terminals of the third P-type transistor and the fourth P-type transistor are coupled to drain terminals of the ninth N-type transistor and the tenth N-type transistor, respectively, and gate terminals of the third P-type transistor and the fourth P-type transistor are configured to receive an inverted secondary input signal and a secondary input signal, respectively; and a fifth P-type transistor and a sixth P-type transistor, wherein source terminals of the fifth P-type transistor and the sixth P-type transistor are coupled to the second reference voltage, drain terminals of the fifth P-type transistor and the sixth P-type transistor are coupled to the drain terminals of the seventh N-type transistor and the eighth N-type transistor, and gate terminals of the fifth P-type transistor and the sixth P-type transistor are configured to receive the enable signal;

wherein the secondary input signal and the inverted secondary input signal are controlled according to the enable signal and the input signal, and the drain terminals of the seventh N-type transistor and the eighth N-type transistor are configured to output the second bias voltage and the third bias voltage, respectively.

12. The voltage level shifter of claim 11, wherein gate terminals of the ninth N-type transistor and the tenth N-type transistor are configured to receive a delayed inverted enable signal, the delayed inverted enable signal has a predetermined delay relative to an inverted enable signal, and the enable signal and the inverted enable signal have opposite logic values.

13. The voltage level shifter of claim 11, wherein the second bias level shifter further comprises:

an eleventh N-type transistor and a twelfth N-type transistor, wherein a gate terminal and a source terminal of the eleventh N-type transistor are coupled to the drain terminal of the seventh N-type transistor, and a gate terminal and a source terminal of the twelfth N-type transistor are coupled to the drain terminal of the eighth N-type transistor.

14. The voltage level shifter of claim 13, wherein drain terminals of the eleventh N-type transistor and the twelfth N-type transistor are configured to receive a delayed inverted enable signal, the delayed inverted enable signal has a predetermined delay relative to an inverted enable signal, and the enable signal and the inverted enable signal have opposite logic values.

15. The voltage level shifter of claim 11, wherein:

when the voltage level shifter operates in a first mode, the enable signal is set to a first voltage level, and the secondary input signal and the inverted secondary input signal are set to the first voltage level; and when the voltage level shifter operates in a second mode, the enable signal is set to a second voltage level, and the secondary input signal and the inverted secondary input signal are set to be equivalent to the input signal and the inverted input signal, respectively.

* * * * *